United States Patent
Em et al.

(10) Patent No.: US 8,441,845 B2
(45) Date of Patent: May 14, 2013

(54) SEMICONDUCTOR MEMORY DEVICE AND CONTROL METHOD THEREOF

(75) Inventors: Ho Seok Em, Icheon (KR); Dong Keun Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 199 days.

(21) Appl. No.: 12/827,901

(22) Filed: Jun. 30, 2010

(65) Prior Publication Data

US 2011/0182114 A1    Jul. 28, 2011

(30) Foreign Application Priority Data

Jan. 28, 2010   (KR) .................. 10-2010-0007860

(51) Int. Cl.
*G11C 11/00*   (2006.01)
(52) U.S. Cl.
USPC ............................ 365/163; 365/148; 977/754
(58) Field of Classification Search ............ 365/46, 365/94, 100, 113, 129, 148, 163; 257/2–5, 257/9, 296, 310, E21.35, E31.47, E27.006; 438/29, 95, 96, 166, 135, 240, 259, 365, 438/482, 486, 597, 785; 977/754
See application file for complete search history.

(56) References Cited

U.S. PATENT DOCUMENTS

| 2008/0068875 A1* | 3/2008 | Choi ....................... 365/148 |
| 2009/0225594 A1 | 9/2009 | Choi et al. |
| 2009/0231899 A1* | 9/2009 | Park ......................... 365/63 |
| 2009/0316474 A1* | 12/2009 | Cho et al. ................. 365/163 |

FOREIGN PATENT DOCUMENTS

KR   1020100116725 A    11/2010

* cited by examiner

*Primary Examiner* — Harry W Byrne

(57) ABSTRACT

A semiconductor memory device substantially prevents a faulty operation from being generated in a read operation, and increases the operation reliability. The semiconductor memory device includes a cell array configured to include a memory element having a different resistance value in response to data, a sense-amp configured to sense and amplify the data, a global bit line configured to couple the sense-amp to a cell array, and a discharge unit configured to discharge the global bit line prior to execution of a read operation.

8 Claims, 6 Drawing Sheets

SEMICONDUCTOR MEMORY DEVICE AND CONTROL METHOD THEREOF

CROSS-REFERENCE TO RELATED APPLICATION

The priority of Korean patent application No. 10-2010-0007860 filed on 28 Jan. 2010, the disclosure of which is hereby incorporated in its entirety by reference, is claimed.

BACKGROUND OF THE INVENTION

Embodiments of the present invention relate to a semiconductor memory device and a method for controlling the same.

Semiconductor memory devices have been rapidly developed to temporarily or permanently store data therein. The semiconductor memory devices have been widely used in a variety of electronic appliances, electronic devices, and personal portable devices. General semiconductor memory devices can freely read and/or write data, and also easily update old data to new data.

The semiconductor memory device has been developed such that it can store an increasing amount of data therein, operate with a small amount of power, and increase or expedite an operating speed. Although a NOR flash memory device or a NAND flash memory device has been widely used as a non-volatile memory, a conventional flash memory device has a disadvantage that it has a slow operating speed.

In order to overcome the above-mentioned disadvantage, a phase change random access memory (PCRAM) has been developed. The PCRAM changes a resistance value of a material contained in a unit cell to another resistance value using a current signal, stores data corresponding to the changed resistance value, and reads a difference in current between two resistance values. The PCRAM includes a material which causes a temperature-based phase change in a unit cell, and a crystal structure of the material changes to a crystalline state or non-crystalline state (also called an amorphous state) according to a temperature generated by a current flowing through the material. For example, the material may use germanium antimony tellurium (Ge2Sb2Te5, GST) whose resistance value is changed according to a crystalline or amorphous state.

BRIEF SUMMARY OF THE INVENTION

Various embodiments of the present invention are directed to providing a semiconductor memory device and a control method thereof that substantially obviates one or more problems due to limitations and disadvantages of the related art.

An embodiment of the present invention relates to a semiconductor memory device and a control method thereof, which discharge electric charges remaining in a global bit line maintained at a floating state in a standby mode using an additional control unit before data is read out through the global bit line and a word line is activated, such that a faulty operation generable in a data read operation of the semiconductor memory device is substantially prevented and the operation reliability is increased.

In accordance with one aspect of the present invention, there is provided a semiconductor memory device including a cell array configured to include a memory element having a different resistance value in response to data, a sense-amp configured to sense and amplify the data, a global bit line configured to couple the sense-amp to a cell array, and a discharge unit configured to discharge the global bit line prior to execution of a read operation.

In accordance with another aspect of the present invention, there is provided a semiconductor memory device including a discharge unit configured to store data in a variable resistance element, detect an amount of current flowing in a current path including the variable resistance element, output the data, and discharge the current path prior to a read operation.

In accordance with another aspect of the present invention, there is provided a method for controlling a semiconductor memory device including storing data in a variable resistance element, outputting the data by detecting an amount of current flowing in a current path including the variable resistance element, and discharging the current path prior to the outputting of the data.

In accordance with another aspect of the present invention, there is provided a phase change memory device including a unit cell configured to include a phase change resistance memory element, a sense-amp configured to read data stored in the phase change resistance memory element, a conductive line configured to couple the unit cell to the sense-amp, and a discharge unit configured to discharge the conductive line in response to a discharge signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Embodiments of the present invention provide a design technology for increasing the operation reliability of semiconductor memory devices that detect data using a change of current with a resistance value of a memory element contained in a unit cell. The above-mentioned technology substantially prevents stress from being applied to a unit cell or wrong data from being detected in a read operation. The stress or the wrong data may be applied to the unit cell or detected in the read operation by unnecessary charges remaining in a current path through which a current signal flows in the read operation.

Specifically, the technology for removing the unnecessary charges by coupling a discharge unit to a global bit line can be applied to all types of non-volatile memories capable of storing or detecting data on the basis of the variation of the current.

Figure 1:
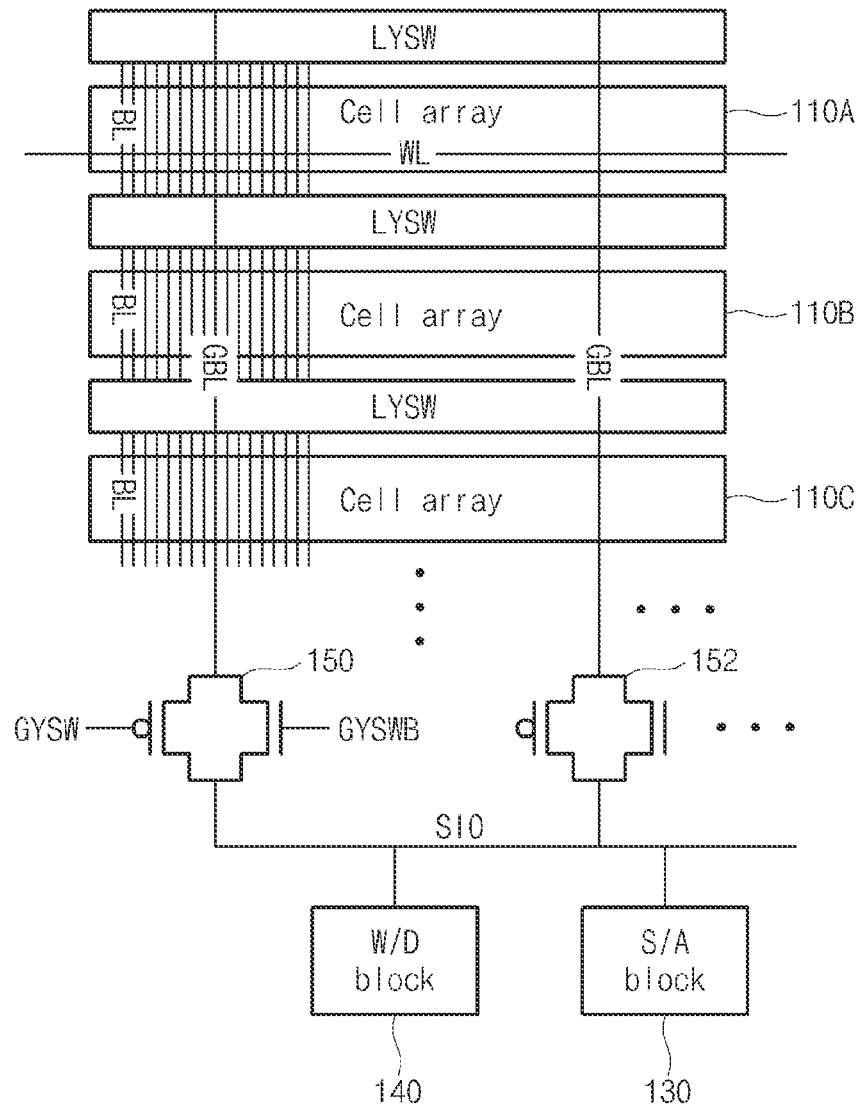
FIG. 1 is a block diagram illustrating a bank for use in a semiconductor memory device according to an embodiment of the present invention.

FIG. 1 is a block diagram illustrating a bank for use in a semiconductor memory device according to an embodiment of the present invention.

Referring to FIG. 1, the semiconductor memory device includes cell arrays 110A, 110B and 110C each of which includes a plurality of unit cells. Each unit cell is coupled to a bit line BL and a word line WL.

The bit line BL is coupled to a global bit line GBL through a bit line switch LYSW. During a read operation, data received through the global bit line GBL is output to an external part by a sense-amplifier (S/A) block 130. During a write operation, data received from the external part is transmitted to a unit cell through a write driver (W/D) block 140.

Transfer gates 150 and 152 enabled by an address decoder are located between the global bit line GBL, and the S/A block 130 and the W/D block 140.

Figure 2A:
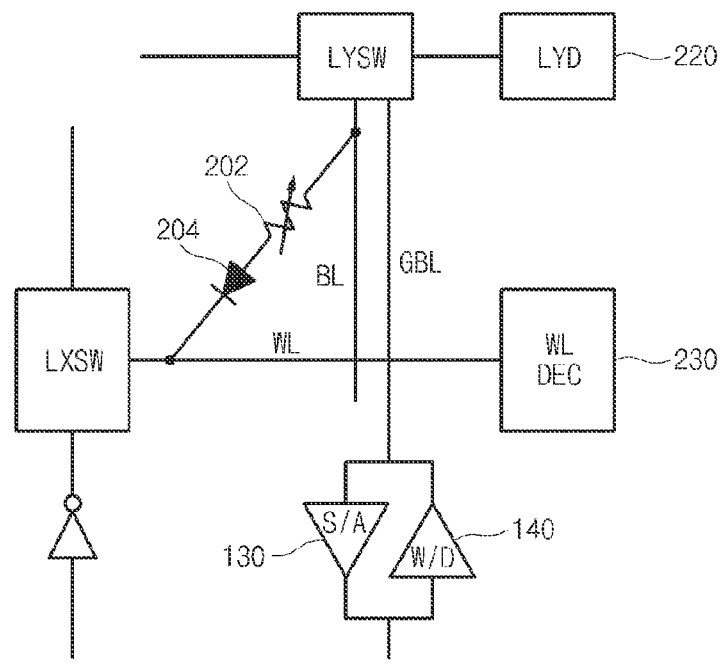
FIGS. 2A and 2B are block diagrams illustrating different examples of a unit cell of the semiconductor memory device shown in FIG. 1.
Figure 2B:
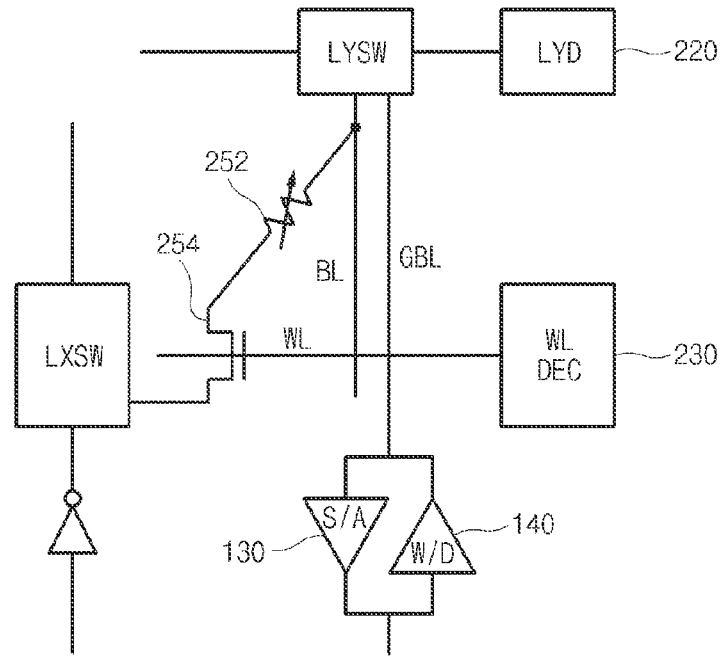

FIGS. 2A and 2B are block diagrams illustrating different examples of the unit cell of the semiconductor memory device shown in FIG. 1.

Referring to FIG. 2A, the unit cell includes a phase change memory element 202 having a resistance value changeable with a current flowing therein, and a diode 204 coupled to the phase change memory element 202. The phase change memory element 202 is coupled to the bit line BL, and the global bit line GBL through the bit line switch LYSW controlled by a bit line driver 220. In the meantime, the diode 204 is coupled to the word line WL, and the word line WL controlled by a word line decoder 230 is coupled to a word line switch LXSW. As can be seen from FIG. 1, the global bit line GBL is coupled to the S/A block 130 and the W/D block 140.

Referring to FIG. 2B, the unit cell includes a transistor 254 turned on or off by the word line WL, instead of the diode 204 of FIG. 2A, and the remaining components other than the transistor 254 may be the same as in FIG. 2A. The transistor 254 is coupled between the phase change memory element 252 and the word line switch LXSW.

Figure 3A:
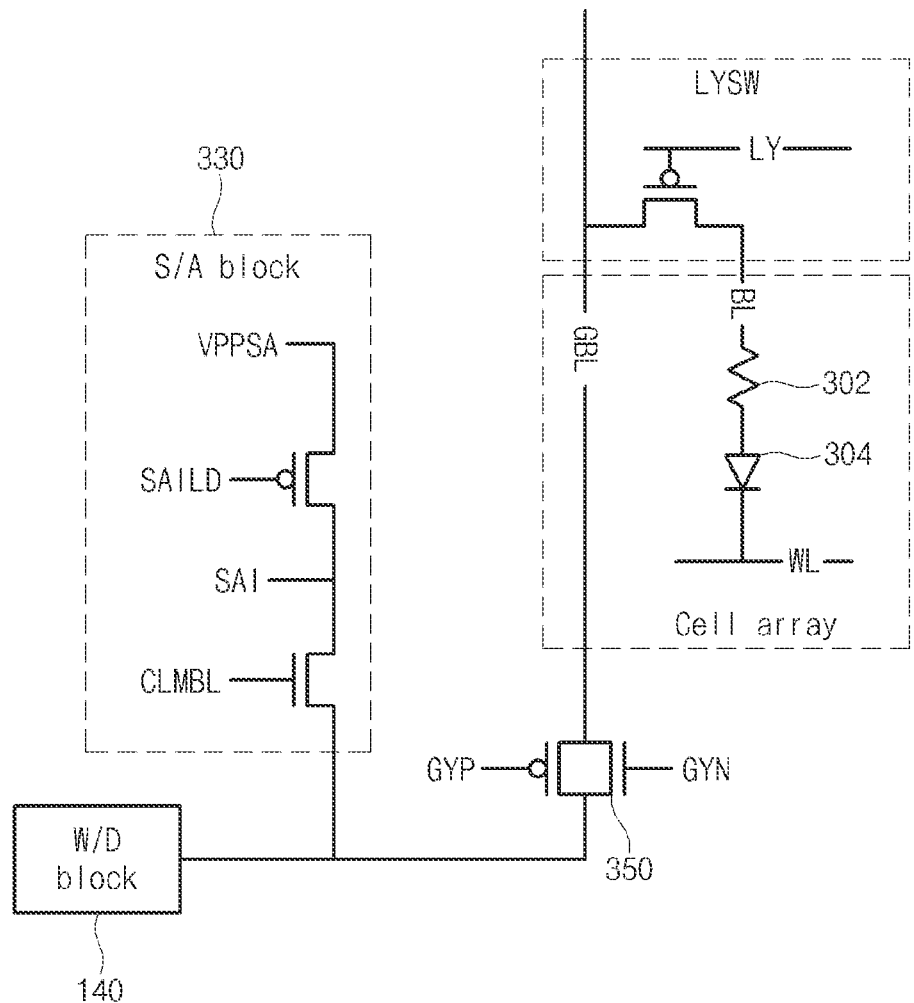
FIGS. 3A and 3B are respectively a circuit diagram and a waveform diagram illustrating a read operation of the semiconductor memory device including the unit cell shown in FIG. 2A according to a first embodiment of the present invention.
Figure 3B:
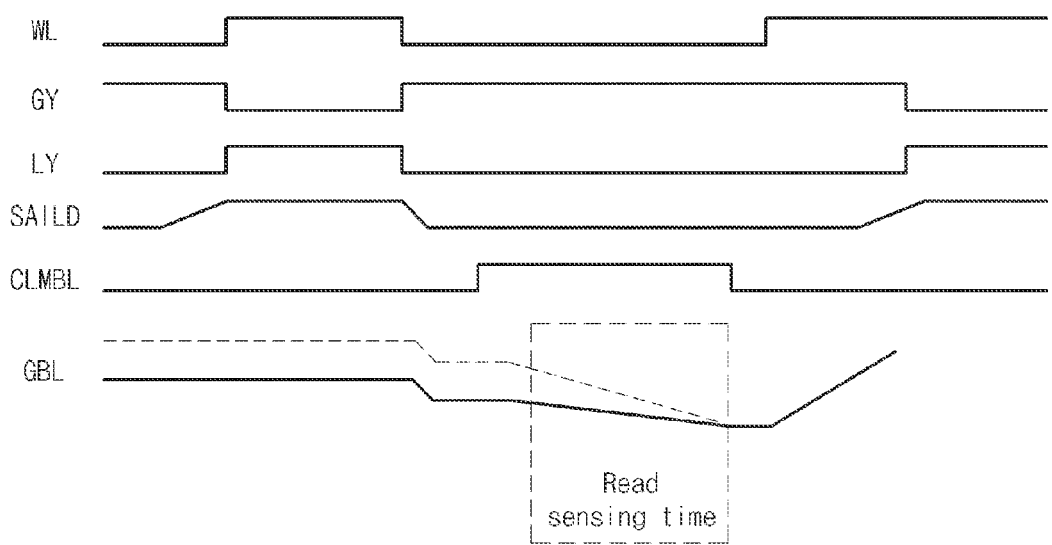

FIGS. 3A and 3B are respectively a circuit diagram and a waveform diagram illustrating a read operation of a semiconductor memory device including the unit cell shown in FIG. 2A according to a first embodiment of the present invention.

Specifically, FIG. 3A illustrates a case in which a read voltage VPPSA for allowing an S/A block to perform the read operation is applied to the unit cell.

Referring to FIG. 3A, the read voltage VPPSA input to an S/A block 330 is transmitted to the global bit line GBL through a data line SIO and a transfer gate 350. If the bit line switch LYSW corresponding to the unit cell is turned on, data, i.e., the read voltage VPPSA, is transmitted to the bit line BL, and then to the word line WL through a memory element 302 and a diode 304 contained in the unit cell. A current path is formed on a transmission path of the read voltage VPPSA, and an amount of current flowing through the current path is determined according to a resistance value of the memory element 302. In this case, the current flowing through the current path is derived from a current mirror circuit contained in the S/A block 330, and the amount of current is sensed by the S/A block 330, such that a data value of the unit cell can be recognized.

Referring to FIG. 3B, during the read operation of the semiconductor memory device, when the word line WL coupled to the unit cell corresponding to an address is activated to a logic low level, a control signal GY for controlling the transfer gate 350 is enabled to a logic high level, and a control signal LY for controlling the bit line switch LYSW is enabled to a logic low level. Thereafter, if control signals SAILD and CLMBL of the S/A block 330 are enabled to a logic low level and a logic high level, respectively, a current path is formed such that an amount of current flowing through the global bit line GBL can be detected.

In the case of a plurality of unit cells contained in the semiconductor memory device, in order to minimize the increase of a unit cell area due to components needed for data input/output (I/O) operations, the global bit line GBL is coupled to the bit line BL through the bit line switch LYSW. However, since the global bit line GBL has high resistance and high capacitance, the read operation of the semiconductor memory device may be adversely influenced.

During the read operation, if the global bit line GBL does not correspond to the address, it is maintained in a floating status by the bit line switch LYSW and the transfer gate 350. If the global bit line GBL is maintained in the floating status under a standby mode, a leakage current generated in the bit line switch LYSW and the transfer gate 350 can be reduced.

Figure 4A:
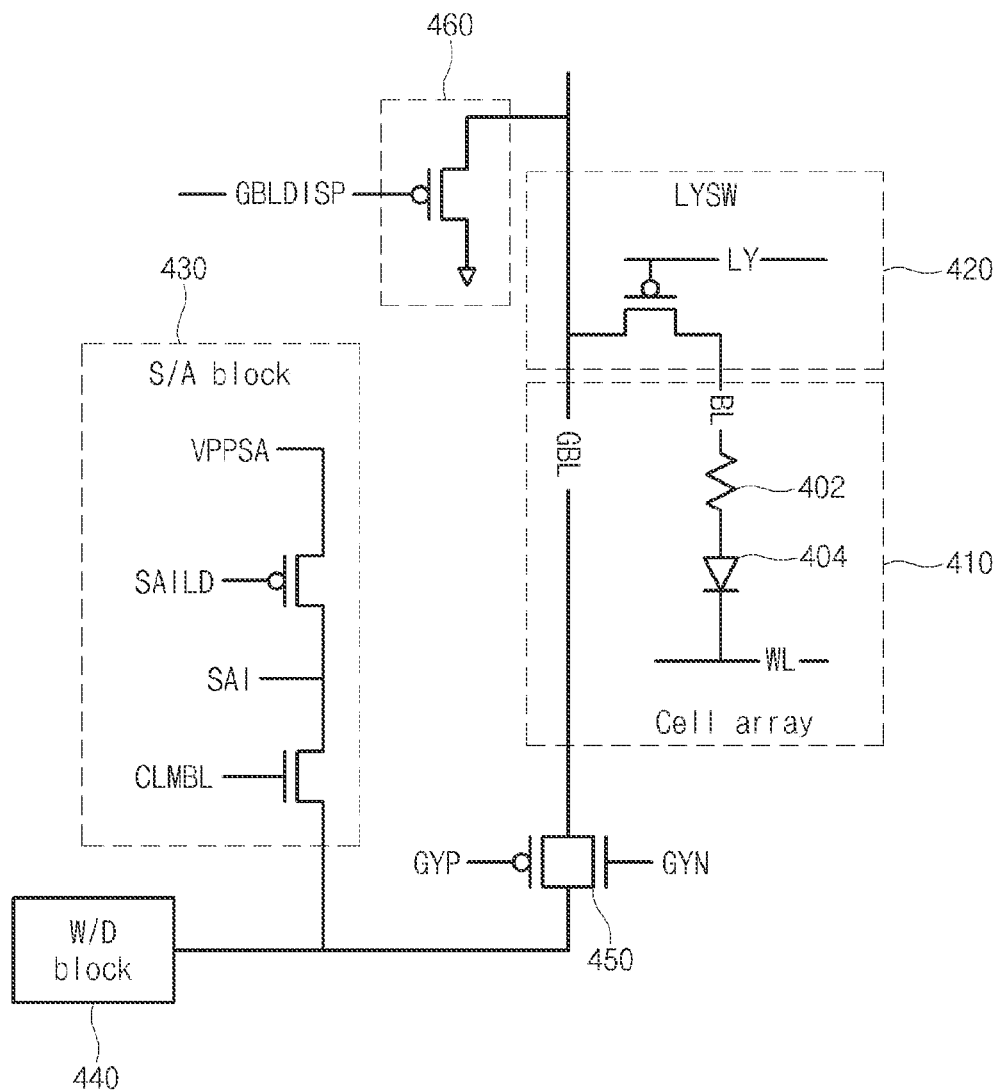
FIGS. 4A and 4B are respectively a circuit diagram and a waveform diagram illustrating a read operation of a semiconductor memory device according to a second embodiment of the present invention.
Figure 4B:
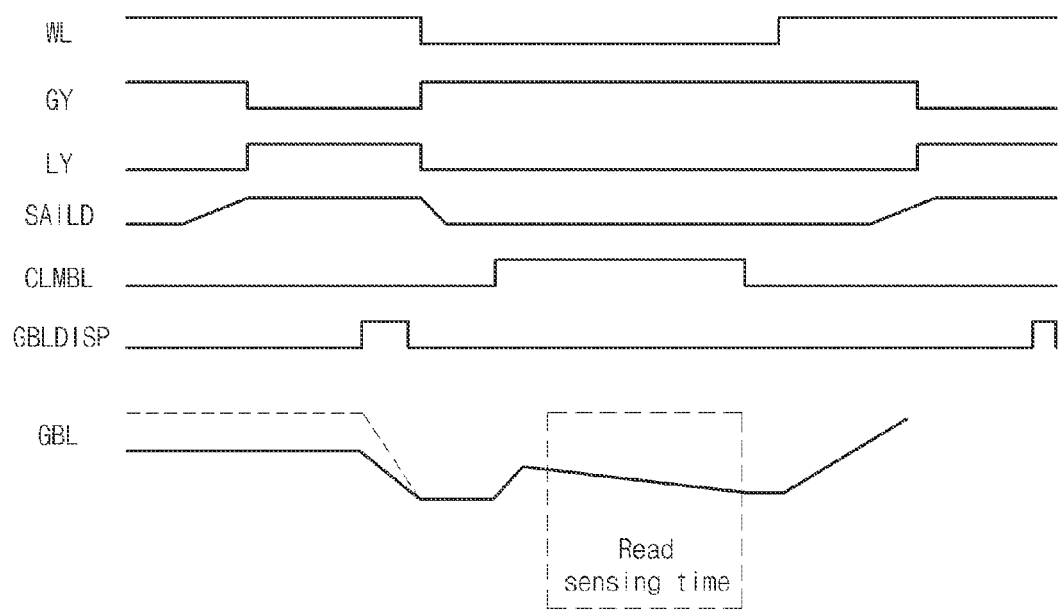

FIGS. 4A and 4B are respectively a circuit diagram and a waveform diagram illustrating a read operation of a semiconductor memory device according to a second embodiment of the present invention.

Specifically, FIG. 4A is a circuit diagram in which a read voltage VPPSA for performing the read operation is applied to a unit cell.

Referring to FIG. 4A, the semiconductor memory device includes a cell array 410 including a plurality of unit cells, a bit line switch 420 for selectively coupling a bit line BL connected to the unit cell to a global bit line GBL, a discharge unit 460 for discharging the global bit line GBL, an S/A block 430 for sensing and amplifying data stored in the unit cell, a W/D block 440 for writing data in the unit cell, and a transfer gate 450 for selectively coupling the global bit line GBL to either the S/A block 430 or the W/D block 440. Each unit cell of the cell array 410 includes a memory element 402 and a diode 404.

During the read operation, the read voltage VPPSA input to the S/A block 430 is transmitted to the global bit line GBL through a data line SIO and the transfer gate 450. If the bit line switch LYSW corresponding to the unit cell is turned on, data, i.e., the read voltage VPPSA, is transmitted to the bit line BL, and then to a word line WL through the memory element 402 and the diode 404 of the unit cell. In this way, a current path is formed in a transmission path of the read voltage VPPSA, and an amount of current flowing through the current path is determined according to a resistance value of the memory element 402. In this case, the current flowing through the current path is derived from a current mirror circuit contained in the S/A block 430, and the amount of current is sensed by the S/A block 330, such that a data value of the unit cell can be recognized.

The semiconductor memory device according to the second embodiment of the present invention further includes the discharge unit 460.

A discharge control signal GBLDISP controls a discharge operation by activating or deactivating the discharge unit 460. If the discharge control signal GBLDISP is enabled, the discharge unit 460 is activated just prior to activation of the word line WL during the read operation, such that it discharges electric charges remaining in the global bit line GBL.

Since the global bit line GBL is in a floating status in a standby mode before the read operation is performed, it may be difficult to estimate the electric potential of the global bit line GBL if the standby mode is maintained for a predetermined time or longer. Therefore, in accordance with the second embodiment of the present invention, the global bit line GBL is compulsorily discharged before sensing data stored in the unit cell.

The discharge unit 460 includes a switch for selectively coupling the global bit line GBL to a ground voltage (VSS) input terminal. For example, the switch may be implemented as an NMOS transistor.

Referring to FIG. 4B, during the read operation of the semiconductor memory device, the discharge control signal GBLDISP is enabled to a pulse-shaped signal before the word line WL coupled to the unit cell corresponding to an address is activated. The discharge unit 460 activated by the discharge control signal GBLDISP discharges electric charges remaining in the global bit line GBL, such that the electric potential of the global bit line GBL incapable of being estimated in the standby mode is decreased to a ground voltage (VSS) level before the word line WL is activated. After that, when the word line WL is activated to a logic low level, a control signal GY for controlling the transfer gate 450 is enabled to a logic high level, and a control signal LY for controlling the bit line switch LYSW is enabled to a logic low level.

Thereafter, if control signals SAILD and CLMBL of the S/A block 330 are respectively enabled to a logic low level and a logic high level, a current path is formed, and the amount of current flowing through the global bit line GBL can be detected.

As described above, the semiconductor memory device according to the second embodiment of the present invention discharges the global bit line, which has higher resistance and capacitance than other components within a core area, prior to the execution of the read operation, and increases an operation margin of the S/A block during the read operation. This substantially prevents data from being wrongly read out and also prevents stored data from being damaged by the stress given to the unit cell.

As apparent from the above description, the semiconductor memory device according to the embodiments of the present invention can be applied to all types of semiconductor memory devices which can detect data through using an amount of current variable with a resistance value of a memory element contained in a unit cell, discharge electric charges remaining in a current path formed in a read operation so as to increase an operation margin of an S/A block, and reduce the stress transferred to the unit cell by receiving a current signal as an input, such that the stability of data and the operation reliability of the semiconductor memory device can be increased.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
    a cell array configured to store data, the cell array including a plurality of unit cells;
    a sense-amplifier block configured to sense and amplify the data;
    a global bit line configured to couple the sense-amplifier block to the cell array; and
    a discharge unit configured to discharge the global bit line prior to performing a read operation of the data stored in the cell array.

2. The semiconductor memory device according to claim 1, further comprising:
    a bit line switch configured to selectively couple the cell array to the global bit line; and
    a transfer gate configured to selectively couple the global bit line to the sense-amplifier block,
    wherein the global bit line is in a floating state in a standby mode.

3. The semiconductor memory device according to claim 2, wherein the sense-amplifier block is configured to receive a read voltage during the read operation so as to form a current path between the global bit line and the cell array, and output the data by detecting an amount of current flowing through the current path.

4. The semiconductor memory device according to claim 2, wherein the global bit line is selectively coupled to a plurality of cell arrays.

5. The semiconductor memory device according to claim 4, wherein each cell array includes:
    a plurality of unit cells, each unit cell including a memory element and a diode for coupling the memory element to a word line; and
    a bit line configured to couple the plurality of unit cells to the bit line switch.

6. The semiconductor memory device according to claim 4, wherein each cell array includes:
    a plurality of unit cells, each unit cell including a memory element and a transistor controlled by a word line; and
    a bit line configured to couple the plurality of unit cells to the bit line switch.

7. The semiconductor memory device according to claim 1, wherein the discharge unit includes a switch configured to selectively couple the global bit line to a ground voltage terminal.

8. The semiconductor memory device according to claim 7, wherein the switch is activated by a pulse-shaped control signal before a word line is activated for the read operation.

* * * * *